United States Patent

Samuels

[19]

[11] Patent Number: 6,101,373
[45] Date of Patent: Aug. 8, 2000

[54] AMPLIFIER SYSTEM

[75] Inventor: John Samuels, Surrey, United Kingdom

[73] Assignee: Nokia Mobile Phones Limited, Espoo, Finland

[21] Appl. No.: 08/982,115

[22] Filed: Dec. 1, 1997

[30] Foreign Application Priority Data

Dec. 2, 1996 [GB] United Kingdom .................... 9625073

[51] Int. Cl.$^7$ ...................................................... H03C 1/62
[52] U.S. Cl. .......................... 455/115; 455/126; 455/127; 330/133; 330/149
[58] Field of Search .............................. 455/232.1, 234.1, 455/234.2, 245.2, 250.1, 302, 207, 194, 69, 65, 334, 337, 115, 126, 116, 127; 375/345; 330/129, 133, 134, 109, 149

[56] References Cited

U.S. PATENT DOCUMENTS

| | | | |
|---|---|---|---|
| 3,733,553 | 5/1973 | Magnante et al. | 455/250.1 |
| 4,121,161 | 10/1978 | Ohsawa | 455/234.1 |
| 4,236,252 | 11/1980 | Kominami et al. | 455/315 |
| 4,247,949 | 1/1981 | Watanabe et al. | 455/232.1 |
| 4,398,060 | 8/1983 | Ienaka et al. | 455/194.1 |
| 4,718,116 | 1/1988 | Jacobs et al. | 455/234.2 |
| 5,172,071 | 12/1992 | Braathen | 330/134 |
| 5,241,284 | 8/1993 | Nyqvist et al. | 330/297 |
| 5,507,023 | 4/1996 | Suganuma et al. | 455/234.1 |
| 5,524,285 | 6/1996 | Wray et al. | 455/115 |
| 5,572,264 | 11/1996 | Mizukami et al. | 455/207 |
| 5,722,062 | 2/1998 | Nakanishi et al. | 455/250.1 |
| 5,831,477 | 11/1998 | Tsumura | 330/133 |

FOREIGN PATENT DOCUMENTS 1086490 10/1967 United Kingdom .

OTHER PUBLICATIONS

United Kingdom Patent Application No. GB 9619705.8 "Amplifier System".
United Kingdom Patent Application No. GB 9619029.3 "Amplifier System".
"Mobile P–Service Satellite System Comparison", International Journal of Satellite Communications; vol. 13, pp. 453–471 (1995) Klaus G. Johnson.
"Mobile star wars," What Cellphoen, Sep. 1996, pp. 60–66.

Primary Examiner—Reinhard J. Eisenzopf
Assistant Examiner—Greta Fuller
Attorney, Agent, or Firm—Perman & Green, LLP

[57] ABSTRACT

An amplifier system for a radio receiver, comprising: an amplifier chain having a first amplifier for receiving a signal derived from a received radio signal and amplifying it to generate a first amplifier signal, and a second amplifier for receiving a signal derived from the first amplifier signal and amplifying it to generate a second amplifier signal; a sensor means for sensing the level of a signal at a point in the amplifier chain; and amplifier control means responsive to the sensor means for, when a relatively high level of signal is sensed, controlling the first and second amplifiers to improve their response.

14 Claims, 4 Drawing Sheets

AMPLIFIER SYSTEM

FIELD OF THE INVENTION

This invention relates to an amplifier system, especially an adaptive amplifier system for a signal receiver, for example a portable telephone handset or satellite receiver.

DESCRIPTION OF THE PRIOR ART

A radio signal receiver typically includes an amplifier chain having filter stages and amplifier stages through which the received radio frequency signal is passed in series. The filter stages and amplifier stages typically alternate throughout the chain. The filters filter out unwanted (out of band) frequencies and the amplifiers amplify the remaining signals. The resulting signal passes to a mixer where it is downconverted, and the signal is subsequently demodulated.

Signal receivers that are especially sensitive (those having a high degree of amplification through the chain) may suffer particular problems. To cope with the extreme sensitivity of the signal the receiver must have a very low noise characteristic (known as noise figure); otherwise the noise will tend to be amplified so that it swamps the signal. However, to achieve the required sensitivity relatively many gain stages may be required: possibly three or more gain stages in the receiver's UHF section alone, whereas a typical mobile telephone has only one or two gain stages. And if a three gain-stage UHF section, for instance, is built using the same principles as a standard receiver section its IIP3 ("third order input intercept point") performance will be relatively poor (perhaps 20 dB worse than that of a comparable signal receiver with only one or two gain stages). Therefore, such a signal receiver will be especially vulnerable to interference from unwanted signals—particularly signals just outside the band of desired frequencies. The problems will be particularly acute if the signal receiver's filters are low insertion loss filters with relatively little attenuation of signals just outside the desired band.

SUMMARY OF THE INVENTION

According to the present invention there is provided an amplifier system for a radio receiver, comprising: an amplifier chain having a first amplifier for receiving a signal derived from a received radio signal and amplifying it to generate a first amplifier signal, and a second amplifier for receiving a signal derived from the first amplifier signal and amplifying it to generate a second amplifier signal; a sensor means for sensing the level of a signal at a point in the amplifier chain; and amplifier control means responsive to the sensor means for, when a relatively high level of signal is sensed, controlling the first and second amplifiers to improve their response.

The amplifier chain preferably ends in a mixer. The amplifier system preferably includes mixer control means responsive to the sensor means for, when a relatively high level of signal is sensed, controlling the mixer to improve its performance/response, for example by means of a local oscillator signal applied to the mixer. The mixer is preferably at the end of a UHF section of the amplifier system.

The said point in the amplifier chain is preferably nearer the output end of the amplifier chain than the input end, most preferably near the output end of the amplifier chain. The said point may be between the second amplifier and the mixer. The said point may be adjacent or connected directly to the input or the output of the second amplifier. Preferably, of the amplifiers in the chain, the second amplifier is the one closest to the mixer.

One or more of the amplifiers may be controlled by means of its biasing. The amplifier control means preferably includes biasing control means for controlling the bias applied to the first and second amplifiers so that when a relatively high level of signal is sensed the bias applied to the second amplifier is adjusted more than that applied to the first amplifier. Preferably, the bias control means is arranged so that bias control cascades towards the input end of the chain as the sensed signal increases in strength. The biasing control means preferably comprises one or more biasing control units, such as amplifiers, connected between the sensor means and respective amplifiers of the chain.

The response of each controlled amplifier is preferably controlled to make it more linear.

The amplifier control means suitably controls the biasing current applied to at least one of the amplifiers by means of an active bias circuit of that amplifier. The amplifier control means suitably controls the biasing voltage applied to at least one of the amplifiers by means of a variable reactance means coupled between an emitter or source of that amplifier and a ground voltage.

At least one of the amplifiers may be a voltage-controlled amplifier.

The amplifier chain may include three or more amplifiers (or "gain stages") connected in series.

The amplifier system is suitably part of a signal receiver, preferably a radio signal receiver, which may constitute a second aspect of the present invention. The signal receiver suitably comprises at least two, and preferably at least three, gain stages coupled in series, suitably between an antenna and a first (or only) mixing means. The said second amplifier is preferably part of which ever of those gain stages is closest to the mixing means. The mixing means preferably downconverts the received signals to provide an intermediate-frequency signal. The amplifier system is preferably part of a handset, such as a radio telephone (or "mobile telephone" or "portable telephone") or a pager.

Satellite/mobile telephones demand especially sensitive signal receivers and, because of the difference in signal strengths between terrestrial radio signals and signals received from satellites, may suffer particularly from problems due to strong out of band interference. For example, one proposed satellite/mobile telephone service is proposed to operate at 2170–2200 MHz and the proposed UMTS terrestrial/satellite telephone network is proposed to operate adjacent to that frequency band. 100 m from a base station the UMTS signal strength may be greater than −30 dBm, and since the typical signal strength at the Earth's surface of the satellite/mobile telephone service may be −100 dBm the UMTS signals are likely to p resent strong potentially interfering signals to a satellite/mobile telephone . Therefore, an amplifier system or signal receiver according to the present invention may advantageously be included in a receiver for signals from a satellite, and/or in a satellite/mobile phone.

BRIEF DESCRIPTION OF THE DRAWINGS

The present invention will now be described, by way of example only, with reference to the accompanying drawings in which.

DETAILED DESCRIPTION OF THE INVENTION

The embodiment of the invention that is illustrated in the figures is an amplifier system for a satellite/mobile telephone handset. The amplifier system comprises an amplifier chain having three amplifiers 37,38,39 connected in series. A detector unit 9 senses the level of the signal at point 8. A feedback circuit shown generally at 10 controls the biasing applied to the amplifiers so as to improve the system's tolerance to interferers within its bandwidth.

Figure 1:
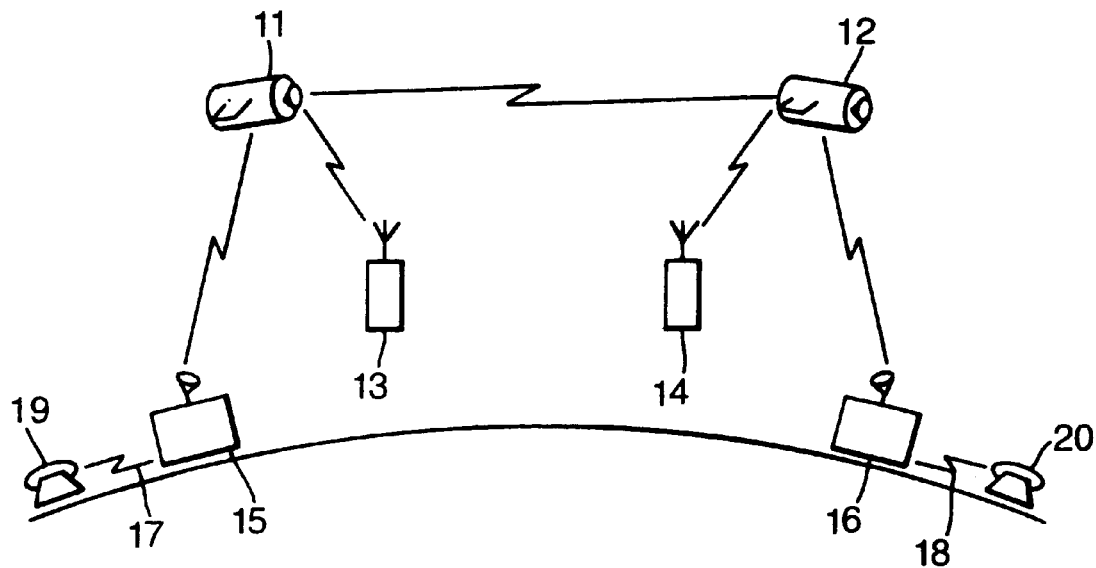
FIG. 1 is a schematic block diagram of a satellite/mobile telephone system.

Referring to FIG. 1, the satellite/mobile telephone system has earth-orbiting satellites 11,12 which may communicate with each other, with telephone handsets 13,14 and with gateways 15,16 to land-line telephone systems 17,18. (In practice the system would typically have more than two satellites and would support numerous mobile telephones.) Through communication with the satellites the mobile telephones can make and receive telephone calls between each other, and to and from telephones 19,20 connected to the land-line systems. Such systems are discussed generally in "Mobile P-System Satellite System Comparison"; International Journal of Satellite Communications, Vol. 13, 453–471 (1995) and "Mobile Star Wars"; What Cellphone, September 1996, pp 60–66.

The distance between any of the mobile telephones and the satellite with which it must communicate may be 40,000 km or more, depending on the altitude of the satellite's orbit and the number of satellites the system employs. Therefore, compared to terrestrial mobile telephone systems the signal received by satellite/mobile telephones will typically be of a relatively low strength and more prone to interference.

Figure 2:
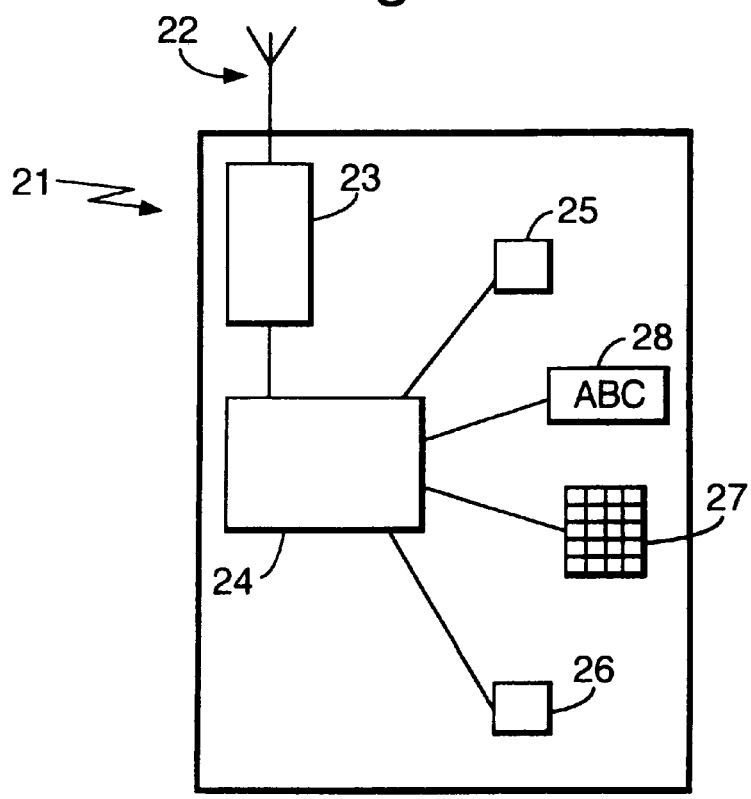
FIG. 2 is a schematic block diagram of a satellite/mobile telephone handset.

Referring to FIG. 2, a satellite/mobile telephone handset 21 (such as telephone handset 13 or 14 in FIG. 1) has an antenna 22; a radio frequency (RF) section 23 for processing the received signals down to baseband and for generating the RF signals to be transmitted by the antenna; and a processor section 24 which contains microprocessors for controlling the telephone and linking the RF section to a speaker 25 and microphone 26. A keypad 27 and display 28 are linked to the processor section to allow a user to control the telephone.

Figure 3:
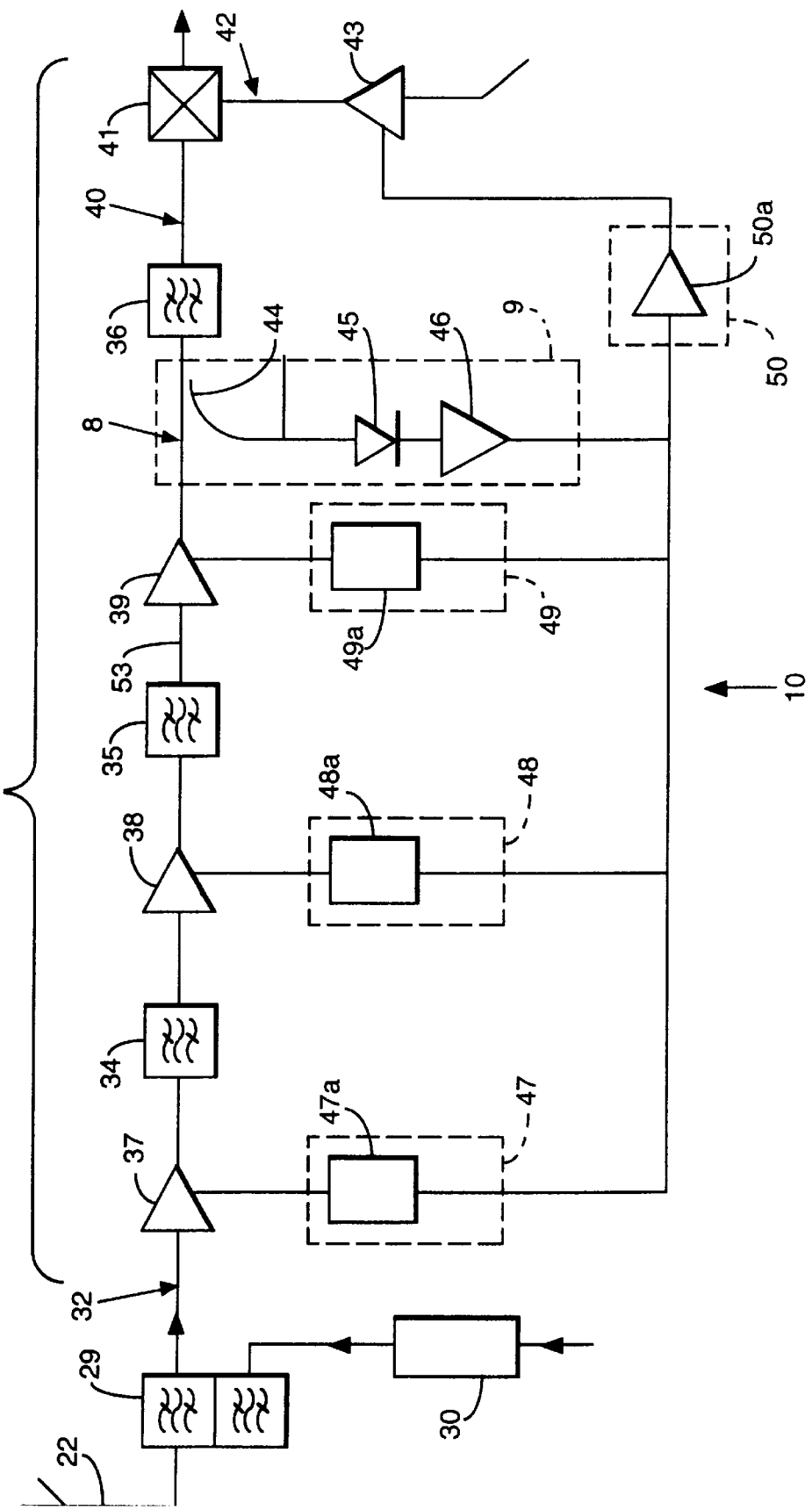
FIG. 3 is a schematic diagram of the electronic architecture of part of the telephone handset shown in FIG. 2.

FIG. 3 shows part of the RF section 23 of the telephone 21 in more detail. A duplexer 29 (or another suitable arrangement, such as a switch) connects the antenna 22 to a UHF transmitting circuit indicated generally at 30 and a UHF receiving circuit 31. In the receiving circuit, from the point 32, there is a chain alternating with ban d-pass filters 34,35,36 and amplifiers 37,38,39. The signal output at 40 from filter 36 enters a mixer 41 where it is downconverted to an intermediate-frequency signal by mixing with a signal at 42 passed via a local oscillator drive 43.

A strong interferer in the signal at 32 is likely to cause the greatest problem at amplifier 39 because the signal input to that amplifier has already passed through two gain stages. Therefore, it is most desirable to control the amplifier 39 to reduce the effect of such an interferer. The first step is to detect the interferer. FIG. 3 shows a detector unit 9 which senses the signal at 8 in the amplifier chain. The coupler could be connected at other locations in the amplifier chain. However, for accurate detection of interferers that may cause the system a problem it is preferable for the coupler to be located near the output end of the chain, for example at 53, 8 or 40 near the amplifier (amplifier 39) that is likely to suffer most from the interferer.

The sensed signal at a point in the chain could be analysed to identify the individual interfering signal or to identify individual frequencies. In practice it is more convenient to sense the strength of the entire detected signal. To achieve this the detector 9 comprises a coupler 44 (e.g. a 15 dB coupler) at the output of amplifier 39 and a diode 45 which receives the output of the coupler.

Once an interferer has been detected the amplifiers 37,38, 39 can be controlled to reduce the affect of the interferer on their responses, for example to make the responses more linear at high signal strengths. The control can be by means of the amplifier's biasing, either current or voltage, as described in more detail below. Amplifier 46, which receives the output of the diode 45, amplifies the output of the diode. Its output passes to control circuits 47,48,49, which are set in parallel and are provided to convert the output of the amplifier 46 to a suitable control signal for each of the amplifiers 37,38,39. This may, for example, involve amplifying or attenuating the output of amplifier 46, or mirroring it, depending on the method of control that is exercised over the respective amplifier. Since the amplifiers 37,38,39 can cope adequately with low-strength signals, the biasing adjustment over those amplifiers is arranged to be nil, or very low, when no strong signal is present. The amplifiers' bias is then substantially the same as in an equivalent prior art circuit, set, for example, by a temperature control circuit. By means of a comparator implementing a step function the feedback circuit 10 could be deactivated entirely when the sensed signal strength is below a threshold.

Balancing circuits 47a,48a,49a in each control circuit allow the degree to which the corresponding one of the amplifiers 37,38,39 is adjusted from its base level in response to an interferer to be itself controlled. Since amplifier 39 is the one that is likely to be most affected by an interferer it is the amplifier to which the greatest controlling adjustment should be applied. As the strength of the interferer increases the biasing adjustment cascades towards the input end of the chain. This behaviour is fixed by means of the balancing circuits 47a,48a,49a —for example by the degree of amplification provided by each one. In other words, the control circuits 47,48,49 are arranged so that an interferer in the received signal causes the greatest effect on amplifiers closest to the output end of the amplifier chain (preferably on the amplifier closest to that end—amplifier 39 in FIG. 3) and progressively less effect on amplifiers further from the output end of the chain (amplifiers 38 and 37 in FIG. 3). Alternatively, or in addition, each balancing circuit could include a comparator implementing a step function to prevent adjustment of the biasing each of the amplifiers 37,38,39 if the strength of the detected signal is below a respective threshold. Different thresholds could apply to each amplifier 37,38,39, preferably so that bias adjustment is staggered between the amplifiers in the chain as interferer strength increases. For example, each amplifier could be adjusted by between half and a quarter the adjustment of the adjacent amplifier nearer the output end of the chain and/or adjustment of each amplifier could only begin when the sensed signal strength is between twice and four times the strength at which adjustment of the adjacent amplifier nearer the output end of the chain is triggered.

A further control circuit 50 controls the effect of the feedback circuit 10 on mixer 41. Control circuit 50 has a balancing circuit 50a arranged to amplify the output of the detector 9 so that when an interferer is detected the local oscillator ("LO") drive level provided to the mixer 41 by the local oscillator drive 43 increases and hence improves the IIP3 of the mixer. Again, a comparator implementing a step function could be used. An alternative arrangement would be to simply increase the current to the mixer 41; if it were an active mixer this method may be preferred.

Figure 4:
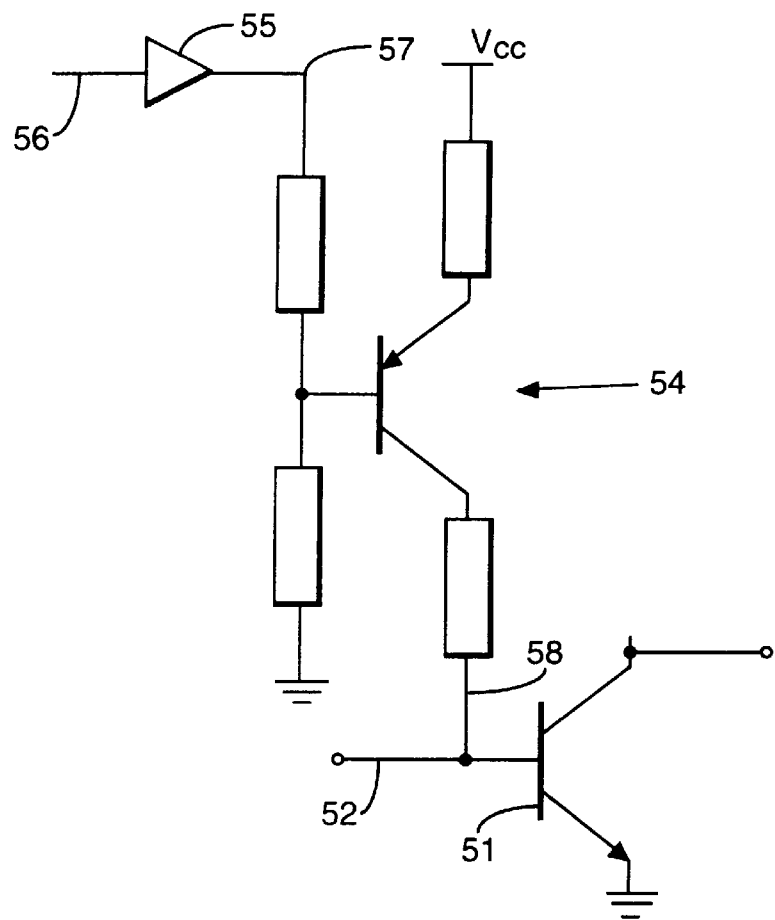
FIG. 4 shows one circuit for controlling the bias applied to an amplifier.

FIG. 4 illustrates one example of how the bias of the amplifiers 37 to 39 could be adjusted. FIG. 4 shows amplifier 51 (a bipolar transistor), which represents a potential embodiment of amplifier 39 in FIG. 3. In this embodiment the emitter of the transistor is connected to ground. Between the input 52 (analogous to point 53 in FIG. 3) and the supply voltage Vcc is an active bias circuit 54, normally used solely for temperature compensation. (Only part of the active bias circuit is shown). Amplifier 55 (analogous to amplifier 46) mirrors and amplifies (by, say, 16 times) changes in the voltage at 56. That amplified signal is connected at 57 to the active bias circuit. (In a typical prior art active bias circuit the point 57 would be connected directly to Vcc). When a signal due to a strong interferer in the signal at 8 reaches amplifier 55 the level of the signal at 57 falls. This causes the current injected at 58 by the active bias circuit 54 into the input of amplifier 51 to increase, and as a result the linearity of the amplifier (as measured by its IIP3 for example) will tend to improve. The effect of this will be to reduce any de-sensitisation and distortion in the amplifier's output, caused by a strong interferer, of in-band signals. The improvement of the linearity of the response of the amplifier (which is notably at high signal strengths) will be at the expense of an increase in power consumption. However, by applying the biasing adjustment selectively when an interferer is detected this increase in power consumption can be kept relatively low. Further details of this arrangement are given in co-pending UK patent application number 9619029.3.

Figure 5:
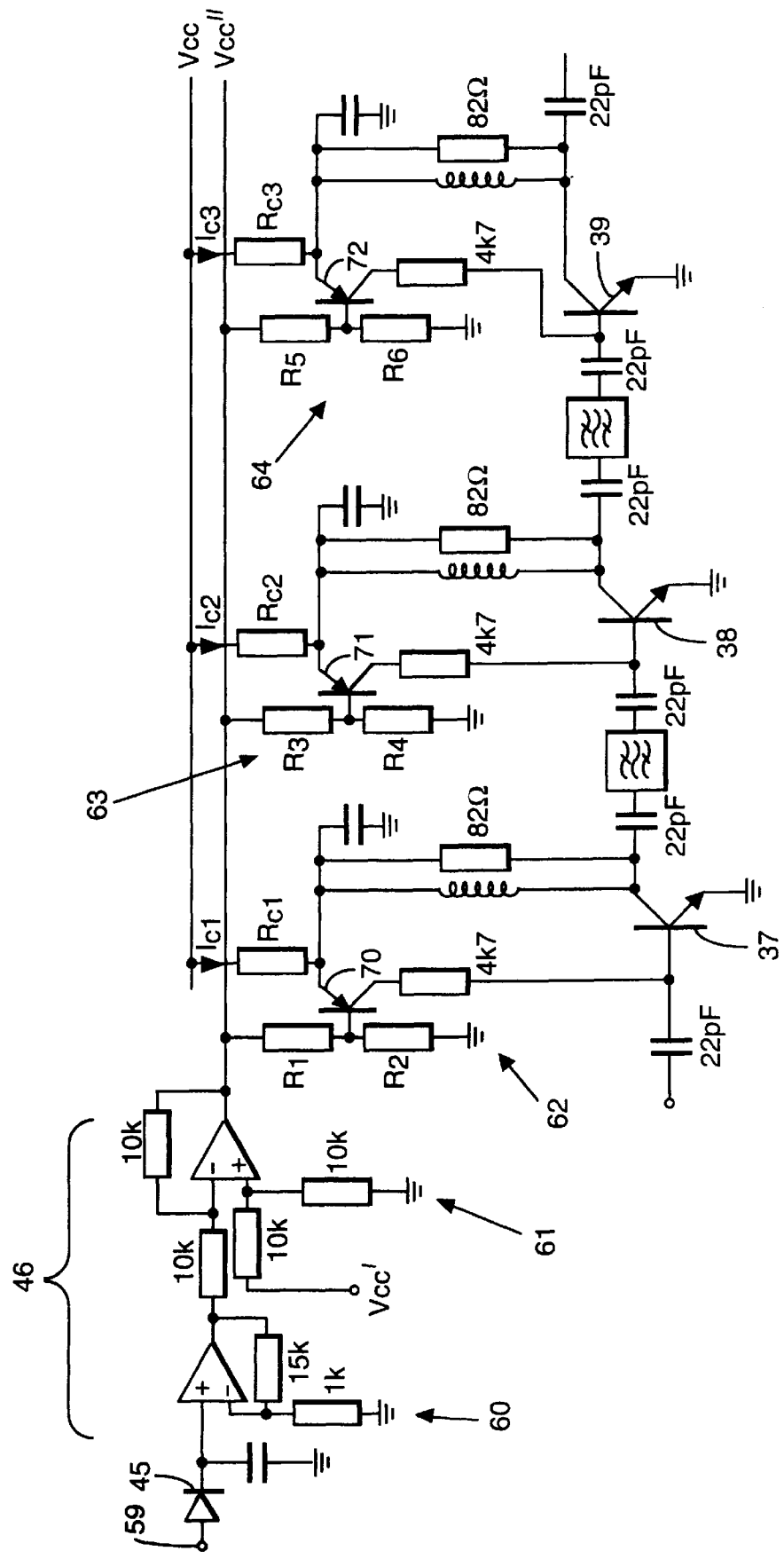
FIG. 5 shows part of the circuit of FIG. 3 in more detail.

FIG. 5 shows a more detailed circuit diagram of part of the amplifier chain and feedback means of FIG. 3. The circuit of FIG. 5 uses the bias control principle of FIG. 4. A signal at 59 output from coupler 8 passes to amplifiers 60,61 which amplify and mirror the signal. Their output passes to bias circuits 62,63,64 which correspond to circuits 47,48,49 in FIG. 3. In the bias circuits the values of resistors $R_1$ to $R_6$ and $Rc_1$ to $Rc_3$ can be selected to provide the desired degree of bias control of each of the amplifiers 37,38,39. The ratios of $R_1$ to $R_2$, $R_3$ to $R_4$ and $R_5$ to $R_6$ determine the rate at which the current increases to each amplifier 37,38,39 as the detected interferer strength increases. Suitable values of these resistors may, for example, be:

$R_1$=30 kΩ

$R_2$=10 kΩ

$R_3$=20 kΩ

$R_4$=10 kΩ

$R_5$=10 kΩ

$R_6$=10 kΩ

$Rc_1$ to $Rc_3$ can then be fixed so that each amplifier 70,71,72 draws the required current. For instance, if Vcc=Vcc'=10V the values of those resistors could be:

$Rc_1$=6.8 kΩ

$Rc_2$=6 kΩ

$Rc_3$=4.3 kΩ so that all the amplifiers 70,71,72 draw 1 mA. Then if, because of an interferer, Vcc" falls to, say half of Vcc', i.e. 5V:

$Ic_1$=1.8 mA $Ic_2$=1.3 mA $Ic_3$=1.6 mA

The ratios are thus selected to provide suitable levels of feedback in the system, for example to provide a suitable compromise between power consumption and linearity of the amplifier chain.

Figure 6:
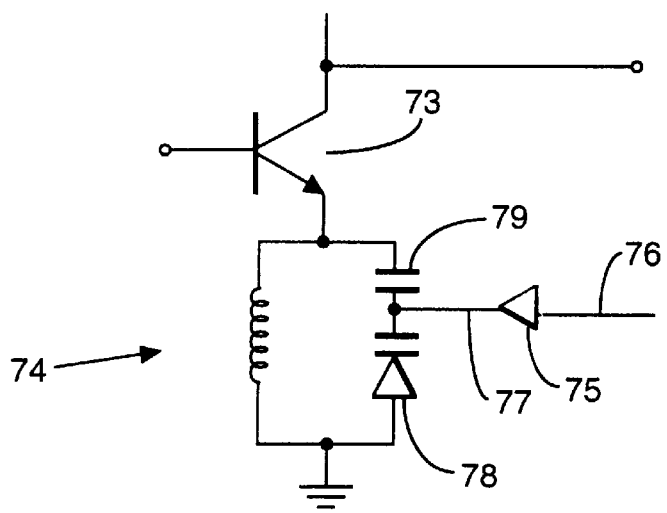
FIG. 6 shows a circuit for controlling the IIP3 of an amplifier by a negative feedback means.

FIG. 6 illustrates a second example of how the the amplifiers 37 to 39 could be adjusted, this time useing negative series feedback. FIG. 6 shows amplifier 73 (a bipolar transistor), which represents a second potential embodiment of amplifier 39 in FIG. 3. The emitter of the transistor is connected to ground through a resonant circuit 74, which, together with amplifier 75, is analogous to the control circuit 49 in FIG. 3. The input 76 to the control circuit is mirrored by amplifier 75 so that the voltage at 77 decreases as the voltage at 76 increases. The amplified signal at is connected at 77 to the resonant circuit 74. The resonant circuit has two limbs connected in parallel. One limb is inductive and the other capacitive. The amplified signal is introduced into the resonant circuit at a point between varactor 78 and capacitor 79, so that a signal at 76 due to a strong interferer in the received signal will cause the capacitance of the varactor 78 to increase, together with the effective inductance on the emitter of the amplifier 73. Again, the linearity of the amplifier 73 (as measured by its IIP3 for example) will tend to improve, particularly at high signal strengths. The effect of this will be to reduce any de-sensitisation and distortion in the amplifier's output, caused by the strong interferer, of the in-band signals. Further details of this arrangement are given in co-pending UK patent application number 9619705.8.

The present invention includes any novel feature or combination of features disclosed herein either explicitly or implicitly or any generalisation thereof irrespective of whether or not it relates to the claimed invention or mitigates any or all of the problems addressed. In view of the foregoing description it will be evident to a person skilled in the art that various modifications may be made within the scope of the invention.

What is claimed is:

1. An amplifier system for a radio receiver, comprising:

an amplifier chain, having a plurality of amplifiers including at least a first amplifier for receiving a signal derived from a received radio signal and amplifying it to generate a first amplifier signal, and an output amplifier for receiving a signal derived from the first amplifier signal and amplifying it to generate an output amplifier signal;

a sensor for sensing the level of a signal at a point in the amplifier chain; and an amplifier control system connected to control the linearity of the amplifier chain responsive to the sensor, wherein the linearity is set to receive low-strength signals and wherein said amplifier control system is adapted to increase the linearity of the amplifier chain, when a relatively high level of signal is sensed.

2. An amplifier system as claimed in claim 1, wherein the control of at least one of the first and second amplifiers is by means of negative series feedback.

3. An amplifier system as described in claim 1, wherein the control of at least one of the first and second amplifiers is by means of its biasing.

4. An amplifier system as described in claim 1, wherein the amplifier chain includes a mixer connected to receive the output amplifier signal and generate an intermediate frequency signal, said mixer adapted to increase the linearity of said mixer in response to said detector.

5. An amplifier system as described in claim 1, wherein the said point in the amplifier chain is near the output end of the amplifier chain.

6. An amplifier system as described in claim 1, wherein the said point is adjacent the input or the output of the output amplifier.

7. An amplifier system as described in claim 1, wherein the amplifier chain includes a second amplifier connected to receive the first amplifier signal and amplifying it to generate a second amplifier signal and wherein the second amplifier signal is received by the output amplifier.

8. An amplifier system as described in claim 1, wherein the amplifier control means controls the biasing current applied to at least one of the amplifiers by means of an active bias circuit of that amplifier.

9. An amplifier system as described in claim 1, wherein the amplifier control means controls the biasing voltage applied to at least one of the amplifiers by means of a variable reactance means coupled between an emitter or source of that amplifier and a ground voltage.

10. An amplifier system as described in claim 1, wherein at least one of the amplifiers is a voltage-controlled amplifier.

11. In an amplifier system for amplifying received low strength radio signals, said system having a plurality of amplifiers amplifier, to receive a radio signal and sequentially amplify said signal, a process of reducing the effects of high strength unwanted signals comprising the steps of:

setting the linearity of each of the amplifiers in the system to receive low-strength radio signals;

sensing the strength of the system at a point in the amplifier cascade and generating a signal relative thereto;

increasing the linearity of each of the amplifiers in response to the sensed signal strength to reduce the effect of unwanted high strength signals; and balancing said increase in linearity among the amplifiers, wherein said increase is greatest in the output amplifier and gradually decreases in amplifiers closer to the input.

12. An amplifier system for a radio receiver, comprising:

an amplifier chain, having a plurality of amplifiers including at least a first amplifier for receiving a signal derived from a received radio signal and amplifying it to generate a first amplifier signal, and an output amplifier for receiving a signal derived from the first amplifier signal and amplifying it to generate an output amplifier signal;

a sensor for sensing the level of a signal at a point in the amplifier chain; and an amplifier control system connected to control the linearity of the amplifier chain responsive to the sensor, wherein the linearity is set to receive low-strength signals and wherein said amplifier control system is adapted to increase the linearity of the amplifier chain, when a relatively high level of signal is sensed; and wherein the amplifier control system further comprises a biasing control system responsive to the sensor for adjusting the bias applied to at least one of the amplifiers in said amplifier chain, wherein said adjustment is preferentially greater in said output amplifier and decreases in said first amplifier.

13. An amplifier system as described in claim 12, wherein the biasing control means comprises a biasing control unit connected between the sensor means and the first amplifier.

14. An amplifier system as described in claim 12, wherein the biasing control means comprises a biasing control unit connected between the sensor means and the second amplifier.

* * * * *

UNITED STATES PATENT AND TRADEMARK OFFICE
CERTIFICATE OF CORRECTION

PATENT NO. : 6,101,373
DATED : August 8, 2000
INVENTOR(S) : John A. Samuels

It is certified that error appears in the above-identified patent and that said Letters Patent is hereby corrected as shown below:

<u>Column 7, claim 11,</u>
Line 28, after amplifiers, insert -- arranged in cascade from an input amplifier to an output --.

Signed and Sealed this

Eleventh Day of September, 2001

Attest:

NICHOLAS P. GODICI
*Attesting Officer*   *Acting Director of the United States Patent and Trademark Office*